United States Patent
Joi et al.

(10) Patent No.: US 11,984,354 B2
(45) Date of Patent: *May 14, 2024

(54) ZINCATING AND DOPING OF METAL LINER FOR LINER PASSIVATION AND ADHESION IMPROVEMENT

(71) Applicant: Lam Research Corporation, Fremont, CA (US)

(72) Inventors: Aniruddha Joi, Milpitas, CA (US); Dries Dictus, Kessel-lo (BE); Yezdi Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 699 days.

This patent is subject to a terminal disclaimer.

(21) Appl. No.: 17/257,207

(22) PCT Filed: Jun. 28, 2019

(86) PCT No.: PCT/US2019/040014
§ 371 (c)(1),
(2) Date: Dec. 30, 2020

(87) PCT Pub. No.: WO2020/006532
PCT Pub. Date: Jan. 2, 2020

(65) Prior Publication Data
US 2021/0166971 A1   Jun. 3, 2021

Related U.S. Application Data

(60) Provisional application No. 62/692,666, filed on Jun. 30, 2018.

(51) Int. Cl.
*H01L 21/768* (2006.01)

(52) U.S. Cl.
CPC .. *H01L 21/76843* (2013.01); *H01L 21/76867* (2013.01)

(58) Field of Classification Search
CPC ........ H01L 21/76867; H01L 21/76843–76846
See application file for complete search history.

(56) References Cited

U.S. PATENT DOCUMENTS

| | | | |
|---|---|---|---|
| 8,722,531 B1 * | 5/2014 | Lin | H01L 21/76843 438/653 |
| 9,385,080 B2 * | 7/2016 | Lin | H01L 21/76889 |

(Continued)

FOREIGN PATENT DOCUMENTS

| | | |
|---|---|---|
| JP | 2008205298 A | 9/2008 |
| JP | 2010283347 A | 12/2010 |

(Continued)

OTHER PUBLICATIONS

PCT International Search Report and Written Opinion of the International Searching Authority issued in corresponding International Patent Application No. PCT/US2019/040014 dated Oct. 23, 2019 (PCT Forms ISA 220, 210, 237) (13 total pages).

*Primary Examiner* — Daniel Luke
(74) *Attorney, Agent, or Firm* — PENILLA IP, APC

(57) ABSTRACT

A method for forming a self-forming barrier in a feature of a substrate is provided, including the following operations: depositing a metallic liner in the feature of the substrate, the metallic liner being deposited over a dielectric of the substrate; depositing a zinc-containing precursor over the metallic liner; performing a thermal soak of the substrate; repeating the depositing of the zinc-containing precursor and the thermal soak of the substrate for a predefined number of cycles; wherein the method forms a zinc-containing barrier layer at an interface between the metallic liner and the dielectric.

20 Claims, 15 Drawing Sheets

Doping of Ru liner for SFB formation

Base pressure : 4 torr (725 sccm N₂)
60 s DEZ / DEZ off, 60 s + 2014 sccm H₂ (8 torr) / base P (x 10)
Pedestal @ 350°C

(56) References Cited

U.S. PATENT DOCUMENTS

| | | | |
|---|---|---|---|
| 9,716,065 B2* | 7/2017 | Kelly | H01L 23/53238 |
| 9,842,805 B2* | 12/2017 | Chen | H01L 21/76846 |
| 10,501,846 B2* | 12/2019 | Venkatraman | H01L 21/76847 |
| 2008/0042281 A1* | 2/2008 | Abe | H01L 21/76867 |
| | | | 438/653 |
| 2008/0124916 A1* | 5/2008 | Hong | H01L 21/76867 |
| | | | 257/E21.495 |
| 2010/0244252 A1* | 9/2010 | Jezewski | H01L 21/76867 |
| | | | 438/653 |
| 2010/0311236 A1 | 12/2010 | DeHaven et al. | |
| 2012/0070981 A1* | 3/2012 | Clendenning | H01L 21/76867 |
| | | | 438/653 |
| 2013/0228923 A1 | 9/2013 | Kolics et al. | |
| 2017/0236752 A1 | 8/2017 | Yu et al. | |

FOREIGN PATENT DOCUMENTS

| | | |
|---|---|---|
| JP | 2017-143266 A | 8/2017 |
| KR | 20160108784 A | 9/2016 |

* cited by examiner

In segregation with two-stage post-anneal -
Post-anneal: 180°C, 90s (in forming gas) → 350°C, 1200s (in forming gas)

Doping of Ru liner for SFB formation

Base pressure : 4 torr (725 sccm $N_2$)

60 s DEZ / DEZ off, 60 s + 2014 sccm $H_2$ (8 torr) / base P (x 10)

Pedestal @ 350°C

ZINCATING AND DOPING OF METAL LINER FOR LINER PASSIVATION AND ADHESION IMPROVEMENT

CLAIM OF PRIORITY

This application is a national stage filing of and claims priority, under 35 U.S.C. § 371, to PCT/US2019/040014, filed on Jun. 28, 2019, and titled "ZINCATING AND DOPING OF METAL LINER FOR LINER PASSIVATION AND ADHESION IMPROVEMENT," which claims the benefit of and priority, under 35 U.S.C. § 119(e), to Provisional Patent Application No. 62/692,666, filed on Jun. 30, 2018, and titled "DOPING OF METAL INTERCONNECT BY SELECTIVE REDUCTION OF METAL OXIDES," both of which are incorporated by reference herein in their entirety.

BACKGROUND

Current technology for creating doped copper interconnect is primarily via physical vapor deposition (PVD). CuMn (manganese-doped copper) and CuAl (aluminum-doped copper), two primary doped copper (Cu) species of interest, are deposited by PVD. This is not a scalable technique for future technology nodes with smaller critical dimension (CD) and larger aspect ratio (AR). Designing an atomic layer deposition (ALD) co-deposition process for CuMn or CuAl for high AR and narrow structures is very challenging. Furthermore, Mn and Al dopants also increase the resistivity of Cu lines significantly (2.8 and 1.25 uohm-cm/at %, respectively). So, alternate dopants that incur less resistance penalty are also desired.

Also, direct Cu metallization of a liner such as Co or Ru by electro-deposition has been a challenge in back end of line (BEOL). Direct plating on a foreign substrate such as the liner material requires extensive surface pre-treatment to reduce the native metal oxide. Otherwise, nucleation of Cu on aforementioned liners is poor. As a result, surface treatment and queue time management is critical for metallization of future interconnects that require direct electroplating on thin liners.

It is in this context that implementations of the disclosure arise.

SUMMARY

Doping of interconnect metal(s) have been desirable for various reasons (e.g. self-formed barriers, electro-migration improvement). In accordance with implementations of the disclosure, a novel method of top-down doping of interconnect metals is provided. This involves depositing a conformal metal oxide layer by well-established techniques (e.g. CVD, ALD, PVD etc.) over the interconnect structure. Metal oxide on the interconnect metal is then selectively reduced to elemental metal by a thermal treatment. The reduced metal diffuses into the interconnect metal providing a doped interconnect.

Also, a conformal zinc oxide layer is used to protect the liner from oxidation. After a thermal treatment in a reducing environment ZnO is reduced to metallic zinc which subsequently migrates to the zinc/dielectric interface providing adhesion and possibly barrier properties. A portion of the unreacted metallic zinc in the liner layer protects the liner from oxidation when exposed to air by preferentially forming a zinc oxide layer.

In some implementations, a method for forming a self-forming barrier in a feature of a substrate is provided, including the following operations: depositing a metallic liner in the feature of the substrate, the metallic liner being deposited over a dielectric of the substrate; depositing a zinc-containing precursor over the metallic liner; performing a thermal soak of the substrate; repeating the depositing of the zinc-containing precursor and the thermal soak of the substrate for a predefined number of cycles; wherein the method forms a zinc-containing barrier layer at an interface between the metallic liner and the dielectric.

In some implementations, the metallic liner consists of ruthenium.

In some implementations, the metallic liner consists of cobalt.

In some implementations, the feature is a via.

In some implementations, the feature is an interconnect.

In some implementations, the zinc-containing precursor is diethyl zinc.

In some implementations, depositing the zinc-containing precursor is performed by a chemical vapor deposition process.

In some implementations, the thermal soak is performed at a temperature of about 180 to 400 C.

In some implementations, the method further includes: after the repeating for the predefined number of cycles, then depositing a conductor in the feature of the substrate.

In some implementations, the conductor is copper.

In some implementations, a method for forming a self-forming barrier in a feature of a substrate is provided, including the following operations: depositing a metallic liner in the feature of the substrate, the metallic liner being deposited over a dielectric of the substrate; depositing an indium-containing precursor over the metallic liner; performing a thermal soak of the substrate; repeating the depositing of the indium-containing precursor and the thermal soak of the substrate for a predefined number of cycles; wherein the method forms a indium-containing barrier layer at an interface between the metallic liner and the dielectric.

In some implementations, the metallic liner consists of ruthenium.

In some implementations, the metallic liner consists of cobalt.

In some implementations, the feature is a via.

In some implementations, the feature is an interconnect.

In some implementations, the indium-containing precursor is trimethyl indium.

In some implementations, depositing the indium-containing precursor is performed by a chemical vapor deposition process.

In some implementations, the thermal soak is performed at a temperature of about 180 to 400 C.

In some implementations, the method further includes: after the repeating for the predefined number of cycles, then depositing a conductor in the feature of the substrate.

In some implementations, the conductor is copper.

Other aspects and advantages of the disclosures herein will become apparent from the following detailed description, taken in conjunction with the accompanying drawings, which illustrate by way of example the principles of the disclosures.

BRIEF DESCRIPTION OF THE DRAWINGS

The implementations of the present disclosure will be understood with reference to the illustrated figures.

DETAILED DESCRIPTION

Figure 1A:
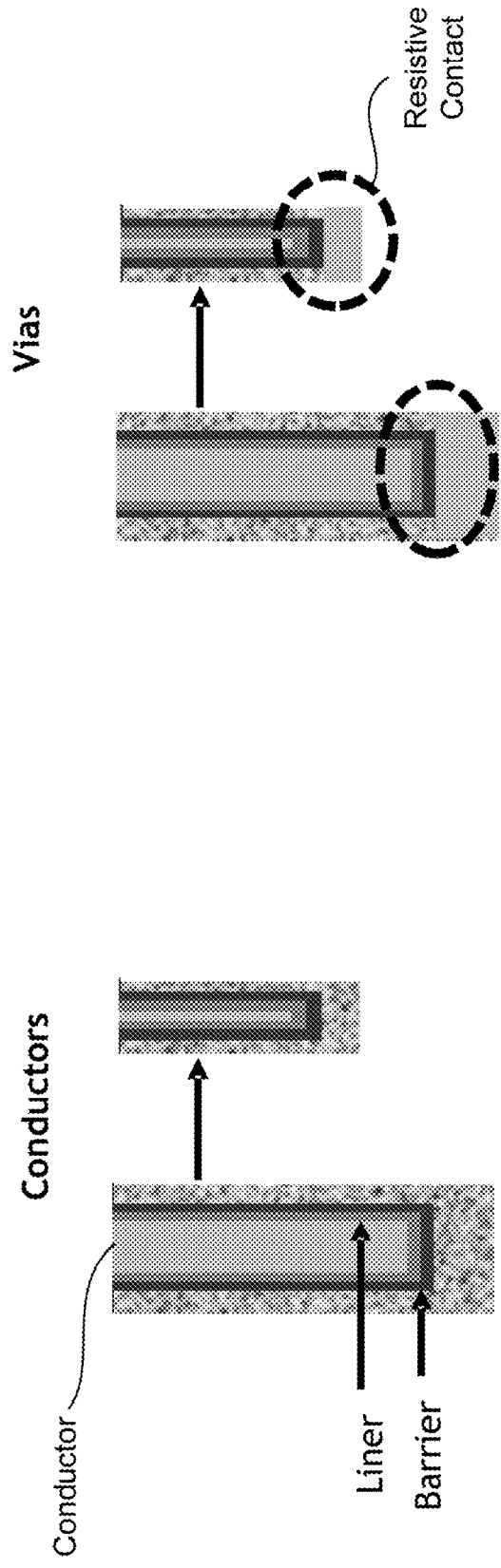
FIG. 1A illustrates the problem occurring as CD sizes shrink to enable next-generation technology nodes.

In the following description, numerous specific details are set forth in order to provide a thorough understanding of the example implementations. However, it will be apparent to one skilled in the art that the example implementations may be practiced without some of these specific details. In other instances, process operations and implementation details have not been described in detail, if already well known.

As used herein, the terms "about" and "approximately" mean that the specified parameter can be varied within a reasonable tolerance, e.g., ±10% in some implementations, ±15% in some implementations, or ±20% in some implementations.

Implementations of the present disclosure provide methods for doping of a metal interconnect, including by electroless co-deposition, by selective reduction of metal oxides, and by thermal dissociation.

The top down doping approach eliminates the need for a co-deposition process in high AR structures for CuX (where X=doping element). It is possible to drive the doping element into the interconnect metal after metallization through: (1) deposition of a metal oxide layer where the metal is the doping element (e.g. metal oxide processes such as for Al2O3, ZnO, MnO2, SnO2, and In2O3 are well established (e.g. ALD, CVD or PVD)); (2) through dosing the interconnect metal with a thermally dissociating precursor (e.g. possibly an ALD precursor) at a high temperature. Furthermore, alternate doping elements are possible such as Zn and In, that are less resistive (0.25 and 1.1 uohm-cm/at. %, respectively) through the presently described top-down doping method.

Such methods enable doping of Cu for generating a self-forming barrier (SFB) and electromigration (EM) improvement to smaller dimensions that are not currently possible with PVD. These sort of SFB and EM boosters will be needed in future technology nodes as barrier scaling stops (increased resistivity) and Jmax (max current) increases (EM failure).

The presently described concepts are applicable for metal oxides such as ZnO SnO2, InO2, and MnO2 (ALD and PVD). By way of example without limitation, considering ZnO as the metal oxide, then after a thermal treatment, ZnO is selectively reduced to metallic Zn on Cu and Ru which diffuses into the underlying metal creating a doped interconnect.

Current technology for directly plating on liner such as Ru or Co involves surface pre-treatment at >300 C to reduce the native metal oxide. Subsequent queue time management is critical to prevent liner re-oxidation. This is a significant challenge as electrochemical nucleation on a foreign substrate is extremely sensitive to surface condition and state.

Zincating has been a known process for metallizing aluminum. In this process, metallic aluminum reacts with Zn(OH)2- in a very alkaline solution to deposit zinc on aluminum. This zinc layer prevents aluminum from re-oxidation and enables aluminum metallization.

However, in implementations of the disclosure, a 'zincation' is provided by a ALD or CVD process followed by thermal treatment. The alkaline process used in traditional 'zincation' is not practical to use in semiconductor manufacturing.

A conformal zinc oxide deposited on a liner material such as Ru, Co, Mo can be reduced to metallic zinc via thermal treatment in a reducing environment. The reduced zinc can (1) form a zinc-silicate compound at the liner/metal interface improving adhesion; (2) protect the liner from re-oxidation when exposed to ambient conditions; (3) improve barrier properties by 'stuffing' the grain boundaries in the liner and through the formation of interfacial compound.

Several other metal oxides may show similar properties —SnO2, In2O3, GeO2, FexOy, MnO2, CoOx.

FIG. 1A illustrates the problem occurring as CD sizes shrink to enable next-generation technology nodes. As feature sizes shrink, there is a loss of conduction area relative to that of barrier and liner layers, so that the high resistance of barrier and liner layers comes to dominate. In the case of conductor lines and vias as shown, the conductor cross-section is being crowded out by the liner and barrier layers, and so current liner/barrier configurations will not scale for future technology nodes. Also, via resistance is becoming the dominant resistance, e.g. in 1D patterning, as the current liner and barrier layers produce a resistive contact, in addition to the shrunken conductor cross-section.

Figure 1B:
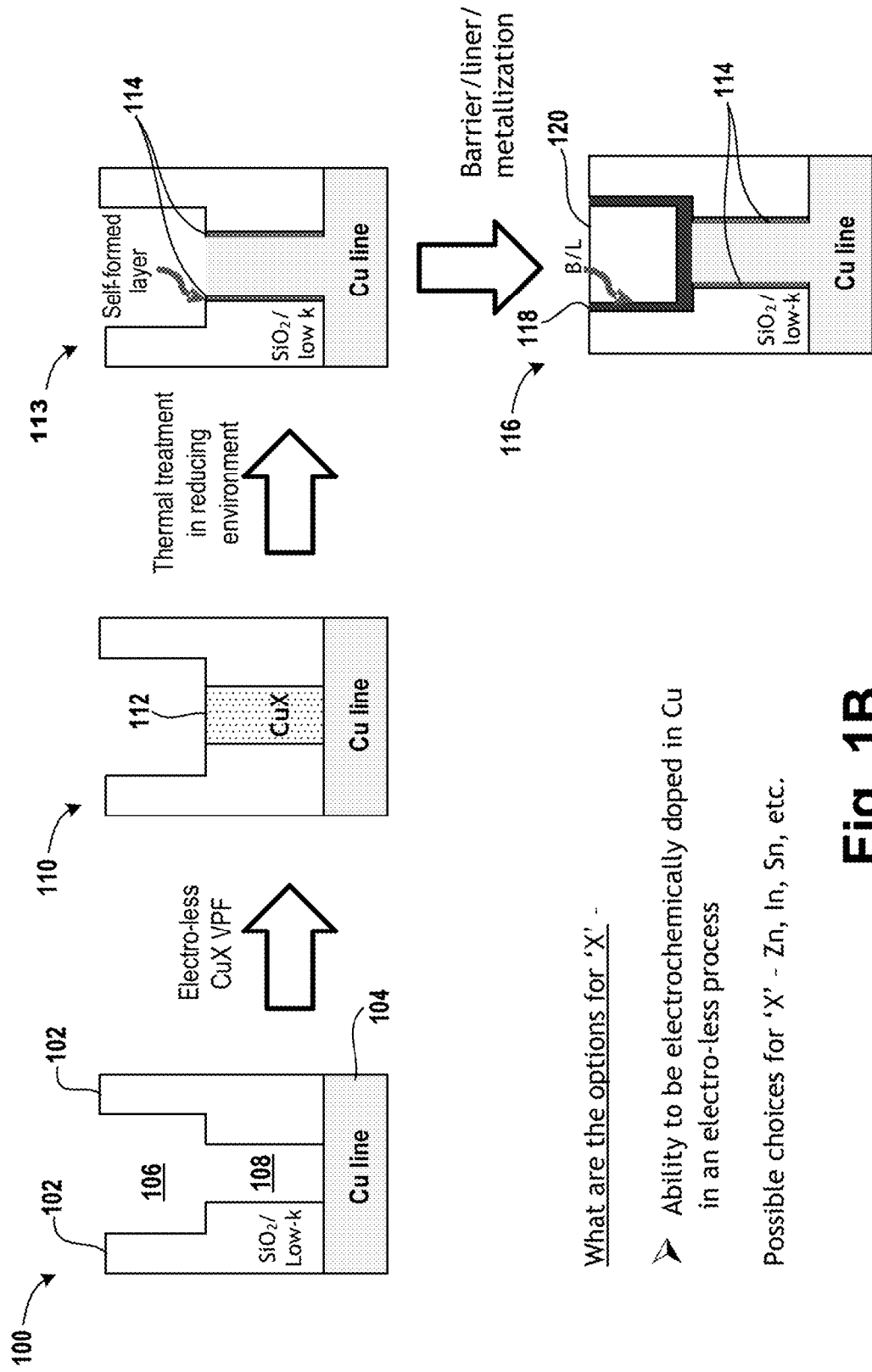
FIG. 1B illustrates a process for forming a self-forming barrier layer, in accordance with implementations of the disclosure.

FIG. 1B illustrates a process for forming a self-forming barrier layer, in accordance with implementations of the disclosure. At reference 100, a cross-section of a an etched interconnect feature in a substrate is shown. The feature includes a via 108 and a trench 106. The feature is patterned in a dielectric, which in some implementations, may be an oxide such as SiO2 or a low-k dielectric. At the bottom of the via is an underlying conductor (Cu) line 104. As shown at reference 110, an electroless deposition process is employed to deposit a via pre-fill (VPF) 112 consisting of a doped copper species CuX (wherein X is the dopant). In various implementations, X can be Zn, In, Sn, or other elements that may be co-deposited with a conductor such as copper by an electroless deposition process and provide a self-forming barrier or adhesion layer as described herein.

Then a thermal treatment in a reducing environment is performed. This causes and/or accelerates a migration of the dopant X to the sidewalls of the via, where it forms a self-forming barrier layer 114, as shown at reference 113. The self-forming barrier layer 114 both improves adhesion to the sidewalls and prevents electromigration. It is believed that the dopant X reacts with the oxide to form complex silicates. It will be appreciated that as the dopant has migrated to the sidewalls, the via pre-fill 112 is now mostly pure copper.

Following generation of the self-forming barrier 114, then a standard metallization process can be performed as shown at reference 116, including for example, deposition of a barrier/liner layer 118, followed by deposition of a bulk conductor 120. In another implementation, only a liner is deposited, and another doped copper fill could be performed, followed by an anneal to form the self-forming barrier similar to that described with respect to the via pre-fill.

There are several advantages to the foregoing process. Via resistance is reduced as the cross-sectional area of the conductor portion of the via is maximized, and further, this process enables electroplating (ECP) Cu for the trench with a reduced aspect ratio because the via has already been filled. This is advantageous because it enables higher aspect ratio vias. In the past, the aspect ratio of the trench and the via could not exceed about 4 to 1 (height to width). But with such a process as described herein, now the filling of the trench can be decoupled from the filling of the via, and so a much taller via can be created, which will lower capacitance between the interlayer. It is also possible to have a taller trench, as though it is limited by aspect ratio, now it is possible to have a taller trench because the fill process)(e.g. ECP) does not need to fill down into the via. So this process reduces via resistance and allows a reduced aspect ratio, which extends the viability of electroplating processes.

Figure 2:
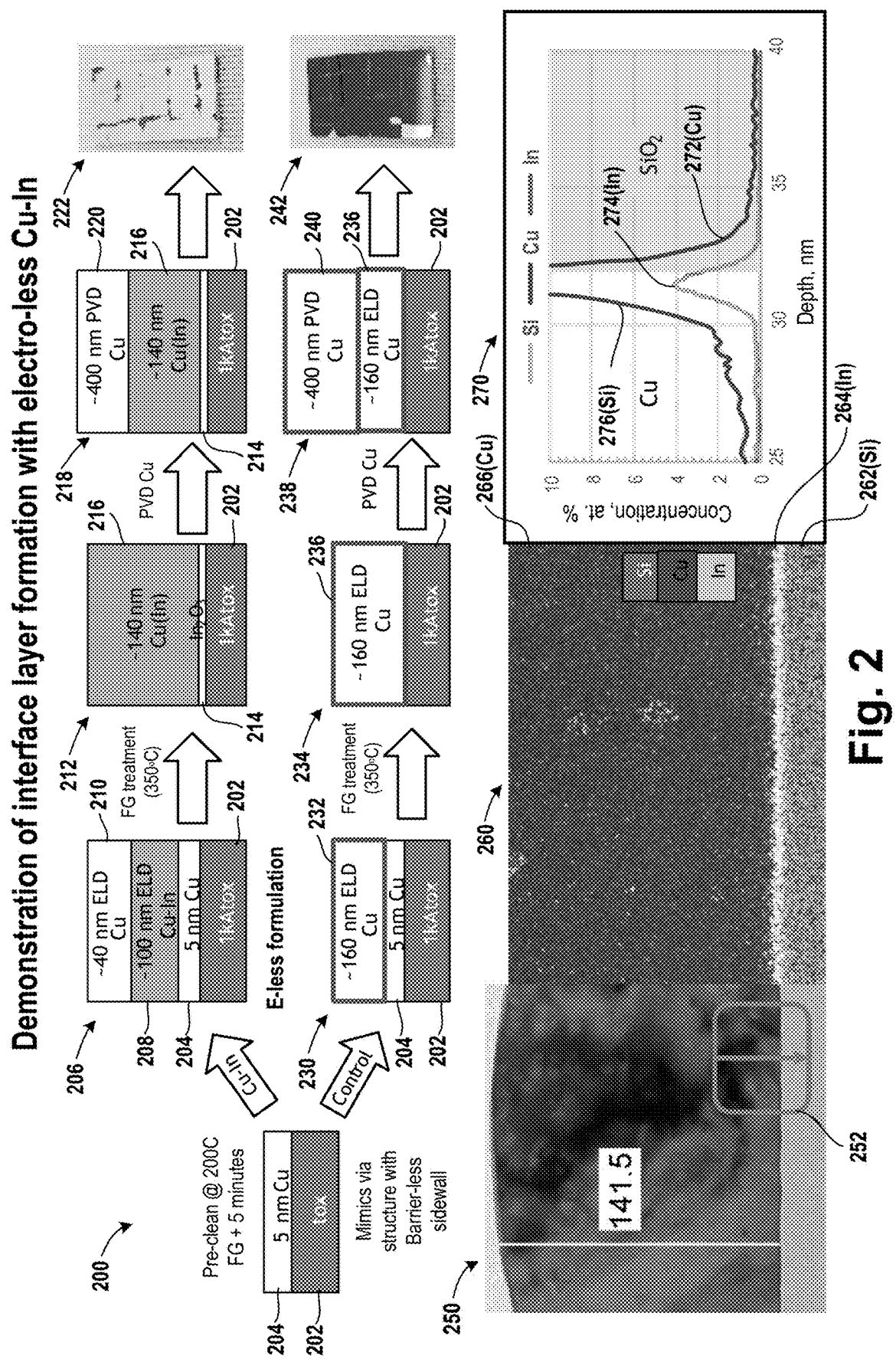
FIG. 2 demonstrates interface layer formation with electroless copper-indium (Cu—In) on a blanket substrate, in accordance with implementations of the disclosure.

FIG. 2 demonstrates interface layer formation with electroless copper-indium (Cu—In) on a blanket substrate, in accordance with implementations of the disclosure. As shown at reference 200, the substrate surface initially consists of a Cu layer 204 (e.g. 5 nm thickness) over a thermal oxide layer 202, which mimics the interfacial structure of a via by way of example without limitation. Then as shown at reference 206, a Cu—In layer 208 (e.g. ~100 nm thickness) is deposited by electroless deposition over the Cu layer 204, and a Cu layer 210 (e.g. ~40 nm thickness) is deposited by electroless deposition over the Cu—In layer 208.

A forming gas anneal was performed at 350 C. The resulting film structure is shown at reference 212. Most of the indium migrates to the interface with the oxide layer 202, where at least some of it is believed to form an indium oxide layer 214 (e.g. In2O3). The remaining bulk Cu layer 216, which includes the two layers 208 and 210, is mostly pure copper, though it may contain trace amounts of indium. The majority of the indium has migrated to the oxide interface, and also possibly migrated to the air interface at the top of the structure if exposed to oxygen, such as may occur when exposed to atmospheric conditions.

For purposes of performing an adhesion test, an additional thick Cu layer 220 (e.g. ~400 nm thickness) is deposited by PVD over the bulk copper layer 216, as shown at reference 218. At reference 222, a substrate processed in accordance with the above process is shown, following performance of a peel test to test the adhesion. As shown, the copper containing layers of the surface structure are mostly intact after the peel test, indicating strong adhesion resulting from the indium oxide layer 214.

A control process was performed on a blanket substrate. As shown at reference 230, a Cu layer 232 (~160 nm thickness) was deposited by electroless deposition over the Cu layer 204. The same forming gas anneal at 350 C was performed, resulting in a bulk copper layer 236 over the oxide layer 202. A thick copper layer 238 was deposited by PVD over the Cu layer 236. The resulting substrate was tested using a peel test, as shown at reference 242. As can be seen, the copper containing layers delaminated from the substrate, indicating the relatively poor adhesion compared with that of the indium containing structure described above.

At reference 250, a transmission electron microscopy (TEM) image shows a cross-section of a portion of the substrate processed as described at reference 212 following the forming gas anneal, including the region of the copper to oxide interface which now includes indium. A subsection 252 was studied by electron diffraction spectroscopy (EDS), and the EDS map is shown at reference 260. As can be seen, the indium (ref. 264) is located between the copper (ref. 266) and the silicon (262) oxide. The graph 270 illustrates the atomic percentage of Cu (curve 272), In (curve 274), and Si (curve 276) as a function of depth. Again, the indium is seen at the transition from copper to silicon oxide.

Figure 3:
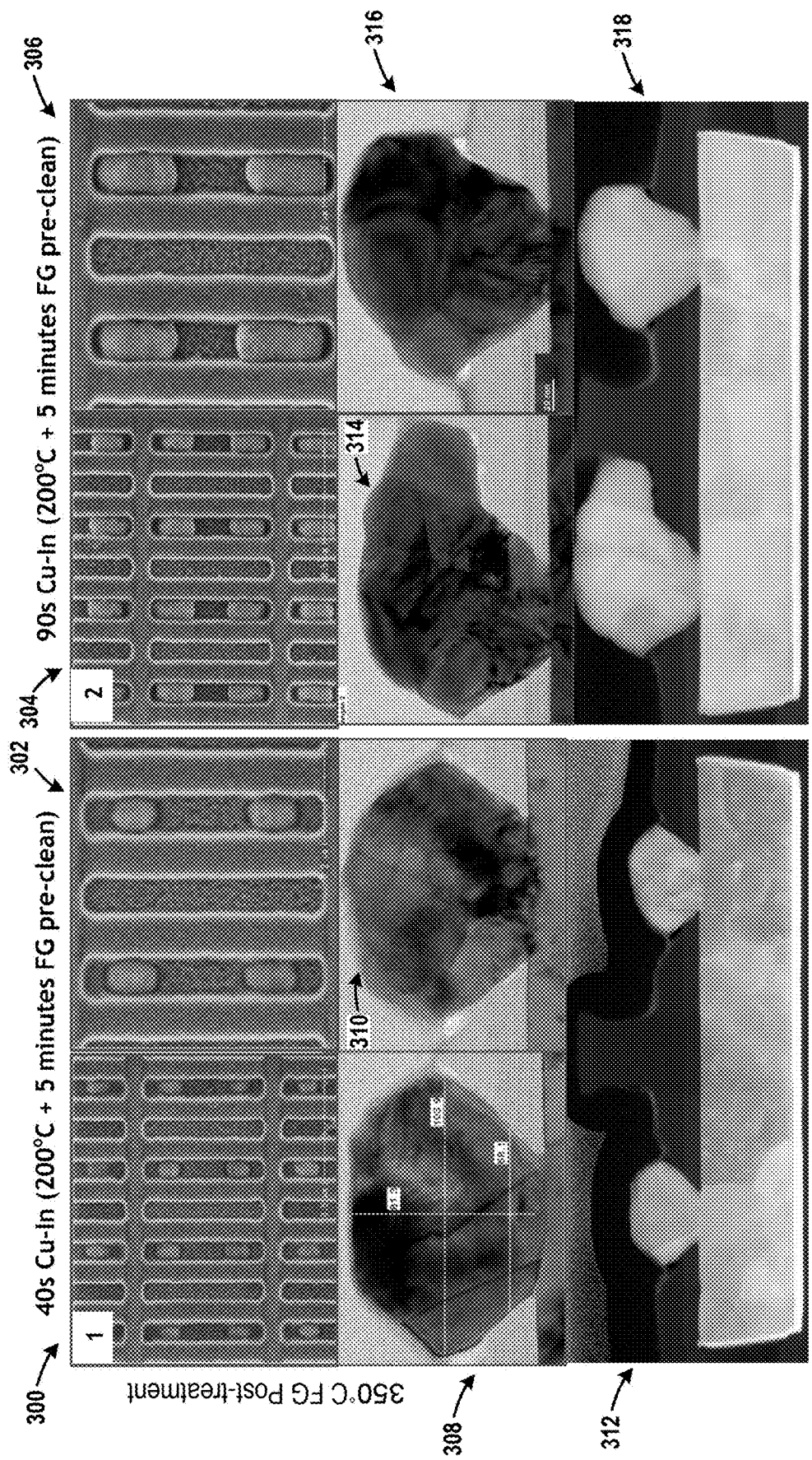
FIG. 3 shows various images of via fills performed by an electroless deposition of copper-indium, in accordance with implementations of the disclosure.

FIG. 3 shows various images of via fills performed by an electroless deposition of copper-indium, in accordance with implementations of the disclosure. Image 300 is a top-down scanning tunneling microscopy (STM) image of a substrate surface having patterned trenches and vias, following via fill by electroless deposition. The substrate was subjected to a pre-clean at 200 C under forming gas for 5 minutes. Electroless deposition of copper-indium was performed by 40 seconds, followed by a 350 C forming gas anneal for 20 minutes. Image 302 shows a magnified view of a portion of the image 300. Images 308 (dimensions of via fill shown in nm), 310, and 312 are cross-sectional TEM images showing the via structure after via fill, in accordance with images 300/302.

Image 304 is a top-down scanning tunneling microscopy (STM) image of a substrate processed similar to that described above, but with electroless deposition of copper-indium performed for a longer time of 90 seconds. Image 306 shows a magnified view of a portion of the image 304. Images 314, 316, and 318 are cross-sectional TEM images showing the via structure after via fill, in accordance with images 304/306. As can be seen, the height and overflow width of the via fill is increased over that of the 40 second fill.

It will be appreciated that an electrolyte deposition solution for electroless deposition of copper indium will include both copper and indium sources, such as chloride salts of copper and indium (e.g. InCl3, CuCl2). In some implementations, the solution includes cobalt as a reducing agent. In some implementations, the solution includes ethylene diamine or another amine-containing molecule as a ligand. In some implementations, electroless deposition is performed at a pH in the range of about 5 to 10, and at a temperature in the range of about 20 to 80 C. In some implementations, the pH is in the range of about 7 to 9. In some implementations, the temperature is at room temperature, or near or about 25 C.

Figure 4:
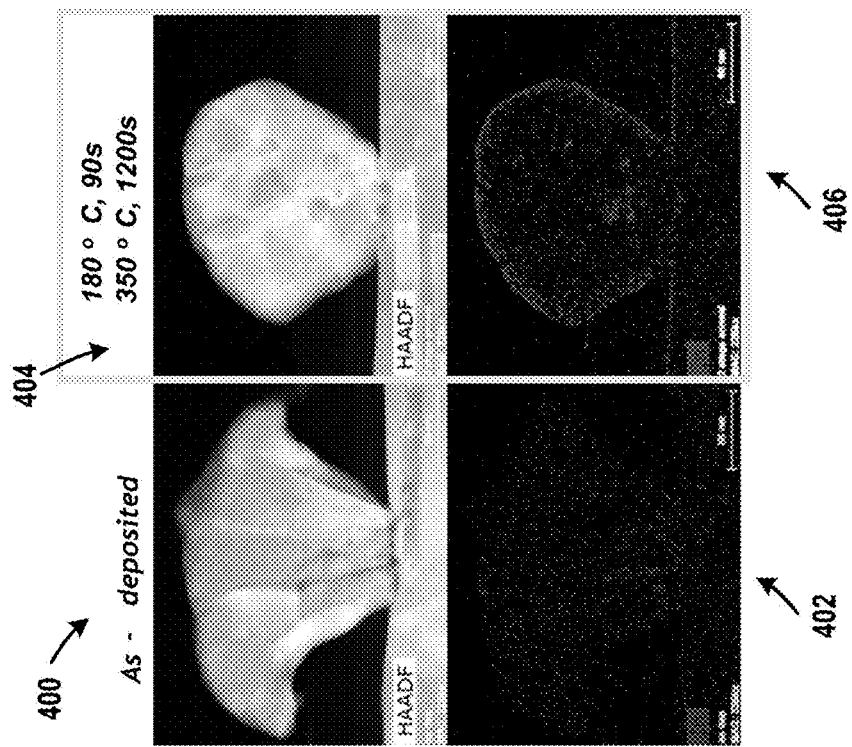
FIG. 4 illustrates various anneal conditions and resulting distribution of indium in a via structure of a substrate, in accordance with implementations of the disclosure.

FIG. 4 illustrates various anneal conditions and resulting distribution of indium in a via structure of a substrate, in accordance with implementations of the disclosure. A via was electrolessly filled (forming a via prefill (VPF)) with copper indium for 90 seconds in accordance with techniques described above, and different annealing methods were performed. The images 400 and 404 show TEM cross-sections of the via fills following different anneal conditions as shown. Corresponding EDS map images 402 and 406 are shown below the TEM cross-sections, indicating the presence and location of indium.

As can be seen, the indium segregation to the via prefill interfaces (with oxide and air) is notably improved with a two-stage anneal (in a reducing environment, e.g. forming gas) that includes a shorter lower-temperature anneal followed by a longer higher-temperature anneal, as shown by the EDS image 406. The migration of indium to the via prefill interfaces is significantly more distinct over the other samples for which only a single low or high temperature anneal was performed.

Accordingly, in some implementations, a two-stage anneal is utilized, consisting of a first anneal at a lower temperature (e.g. in the range of about 150 to 200 C) followed by a second anneal at a higher temperature (e.g. in the range of about 300 to 400 C). In some implementations, the first anneal is of a shorter duration (e.g. in the range of about 1 to 5 minutes), whereas the second anneal is of a longer duration (e.g. in the range of about 10 to 30 minutes).

Figure 5:
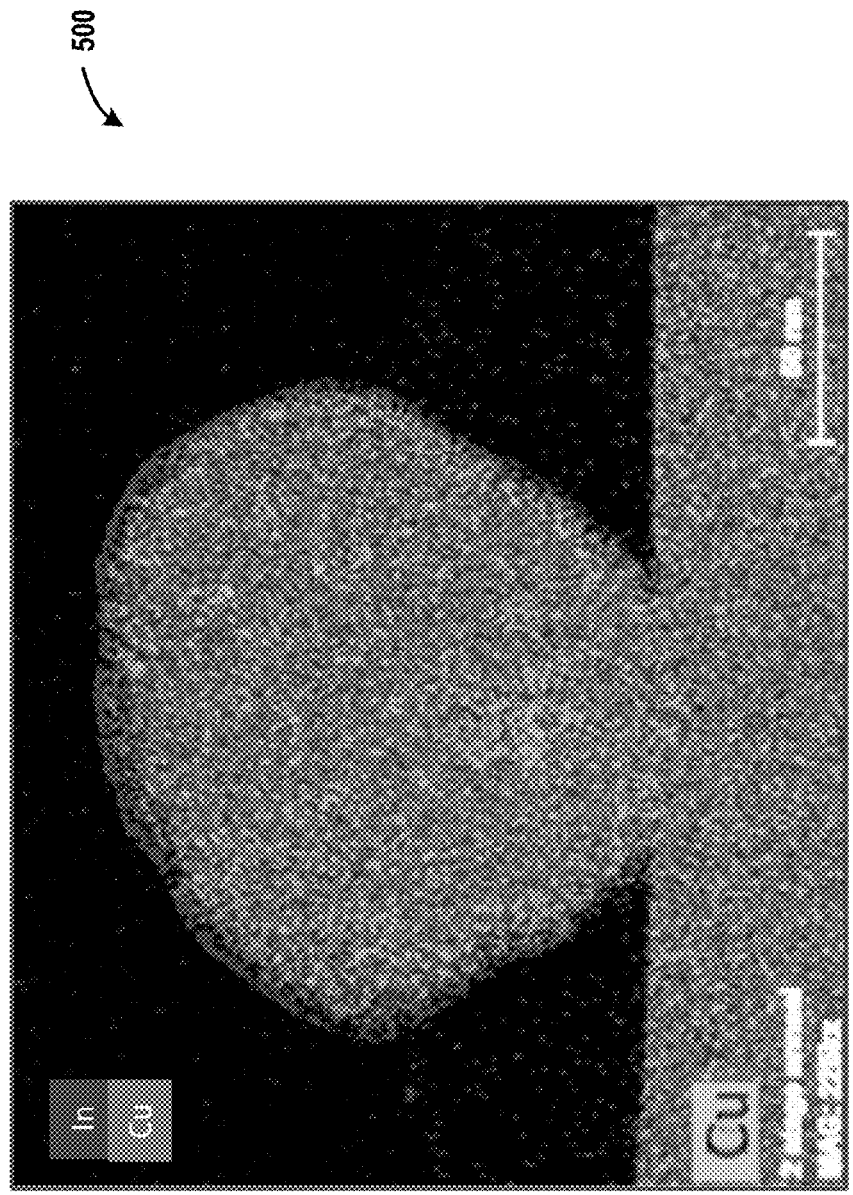
FIG. 5 shows an EDS map image 500, illustrating the presence of indium and copper in a via prefill following a two-stage anneal as described above in accordance with implementations of the disclosure.

FIG. 5 shows an EDS map image 500, illustrating the presence of indium and copper in a via prefill following a two-stage anneal as described above in accordance with implementations of the disclosure. As shown, the indium is concentrated at the outer edges of the via prefill structure, leaving the via prefill itself as mostly pure copper.

As described in the present disclosure, conductor metal (copper) can be doped and annealed to achieve a self-forming barrier. It is noted that any electronegative dopant metal (e.g. Zn, In, Sn) should migrate towards the oxide sidewalls and quench the oxidizing agents in the sidewalls, and thereby prevent copper from getting oxidized. However, a challenge remains of how to specifically dope certain metals. Electroless deposition as described above is advantageous for providing selective deposition (e.g. in a via). However, while copper can be electrolessly deposited fairly easily, electroless doped copper can be challenging depending upon the dopant. For example, highly electronegative elements like zinc and manganese, may be difficult to co-deposit with copper via electroless deposition.

In view of the foregoing, another way to provide the metal necessary to achieve the self-forming barrier is the employ a vapor phase process to infuse the metal (e.g. Zn, In, Sn, Mn) from the top of the structure (e.g. via prefill structure). Thus, in some implementations, a conformal zinc-oxide layer can be deposited, then reduced back to metallic zinc, which diffuses into the conductor metal. Another way that has been recently discovered is by direct thermal dissociation, using a CVD-like process. For example, it has been found that a zinc precursor can be dispensed onto the wafer which is heated, and the zinc precursor selectively breaks down on the metallic portion of the wafer, and diffuses into the metal.

Figure 6:
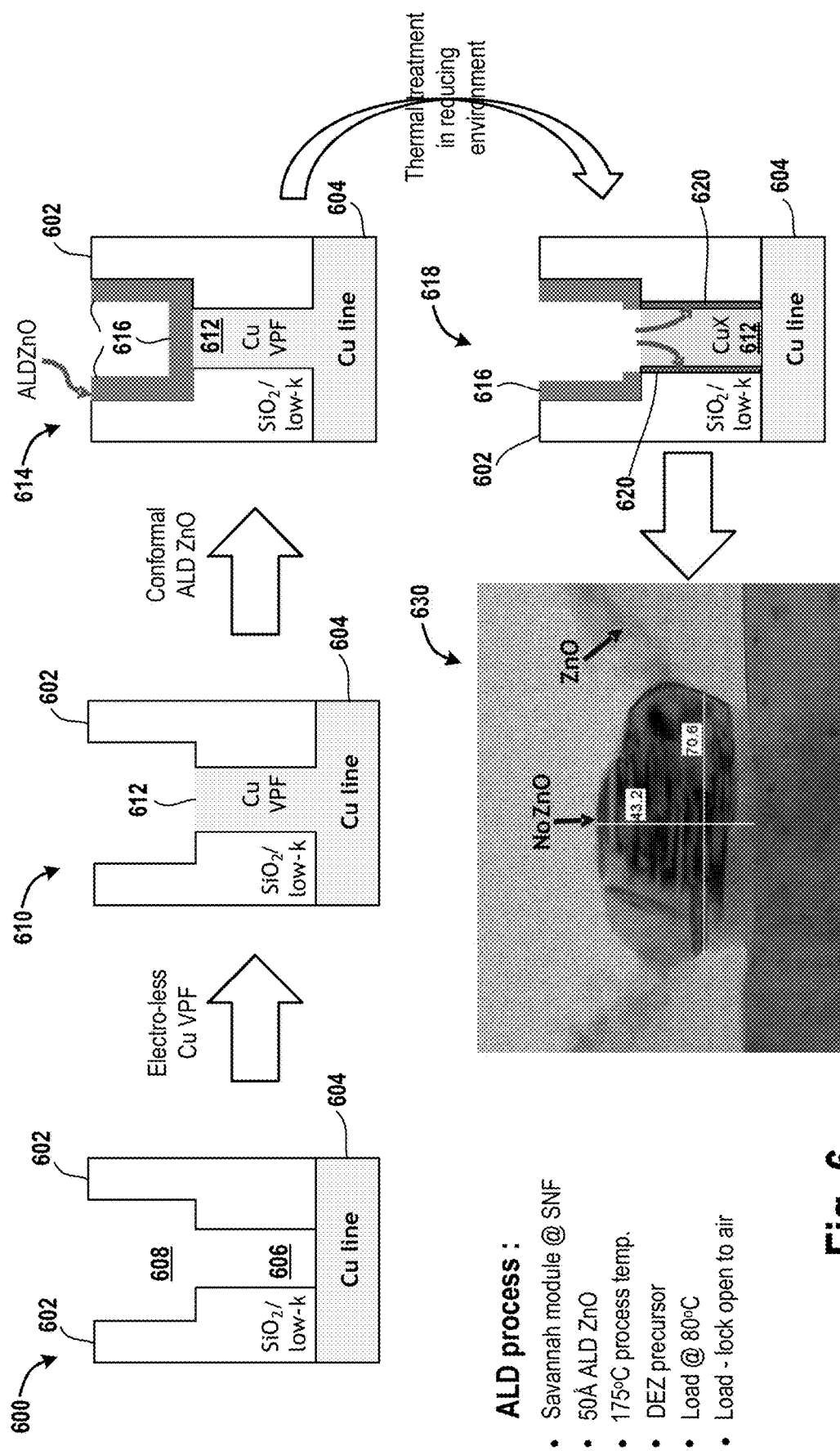
FIG. 6 illustrates a process for generating a self-forming barrier via annealing of a metal oxide layer, in accordance with implementations of the disclosure.

FIG. 6 illustrates a process for generating a self-forming barrier via annealing of a metal oxide layer, in accordance with implementations of the disclosure. As shown at reference 600, a patterned feature in a substrate surface is shown, including a via 606 and trench 608 etched in an oxide 602, to form an interconnect to an underlying conductor line 604 (e.g. copper). An electroless deposition process is employed to deposit a via prefill 612 (e.g. copper), as shown at reference 610. The electroless deposition process is advantageous as it is selective for the conductor line 604.

As shown at reference 614, a conformal metal oxide layer 616 (e.g. ZnO, MnO2, SnO2, In2O3) is deposited in the trench 608 by a conformal deposition process, such as ALD, PVD, or CVD. Then a thermal treatment (or anneal) in a reducing environment is performed. In some implementations, the thermal treatment is in the range of about 200 to 350 C. In some implementations, the reducing environment is defined by a forming gas environment. The thermal treatment causes the metal oxide situated over the via prefill 612 to selectively breakdown, so that the metal diffuses into the underlying via prefill and further migrates to the interface with the oxide sidewalls of the via, forming a self-forming barrier 620 at the interface that improves adhesion and inhibits electromigration.

Image 630 is a TEM cross-section image of a via structure processed in accordance with the above described method, using a zinc oxide film deposited over a Cu via prefill. As shown, there is no ZnO on the via prefill itself following the thermal treatment, as the ZnO has been reduced to metallic Zn, which has then diffused into the Cu via prefill. The Zn may migrate to the via sidewalls to the interface between the copper and the oxide, and form a self-forming barrier. As noted above, the self-forming barrier may in part be due to formation of zinc silicates at the sidewalls.

In some implementations, the thermal treatment also causes the remaining zinc oxide layer 616 (that is not over the via prefill 612) to form a zinc silicate (e.g. along the sidewalls of the trench 608. This is advantageous as it achieves a continuous barrier along both the trench and via walls through the same process. Further, bulk fill of the trench can be performed (e.g. by electroless deposition which provides selectivity to the copper), and the conductor cross-sectional area is maximized and resistive contacts are avoided, all of which improves electrical performance.

In some implementations, the remaining zinc oxide layer 616 (that is not over the via prefill 612) is removed with, for example, water or acid.

Figure 7:
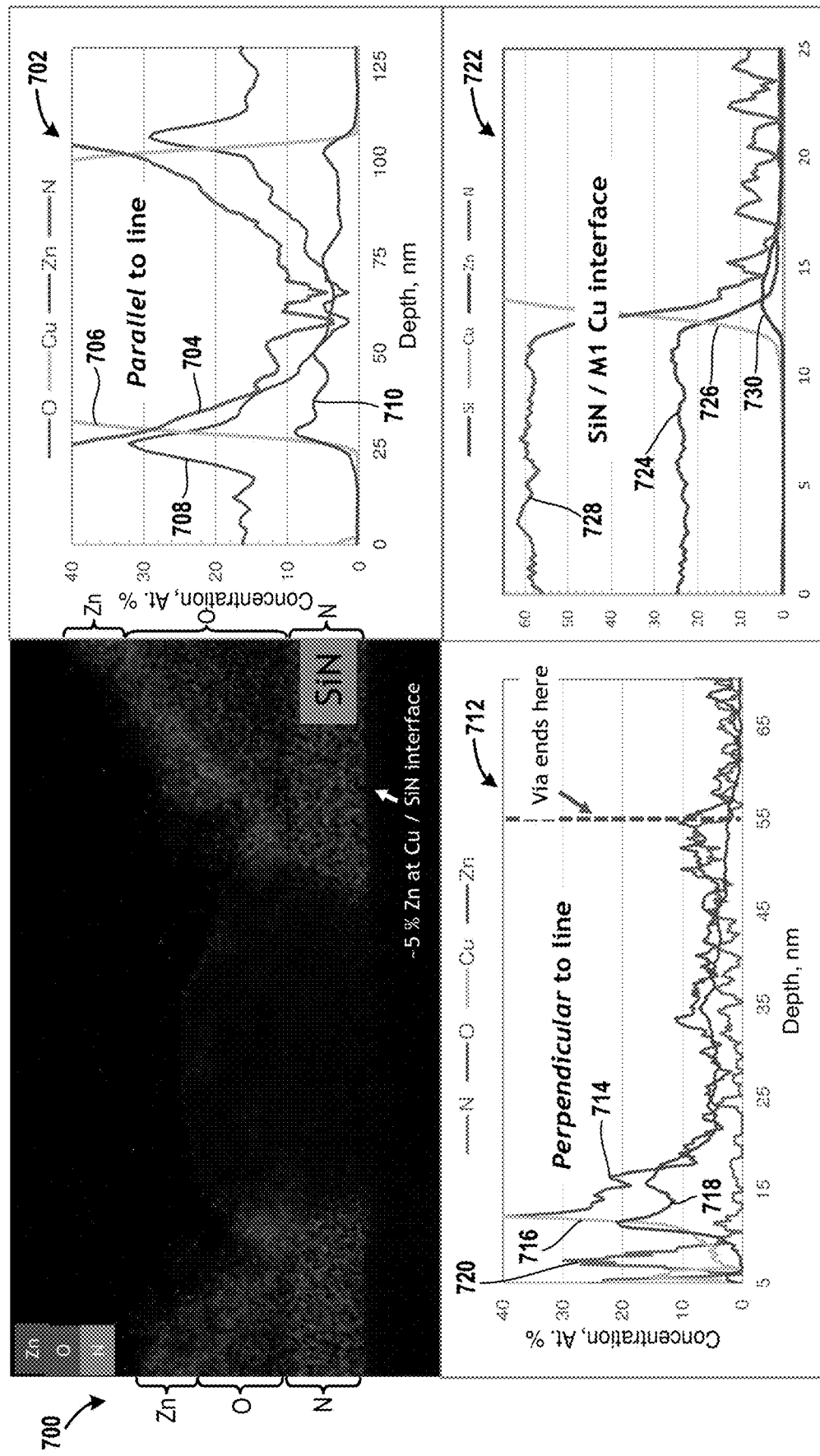
FIG. 7 shows characterization of a via structure processed in accordance with the above-described process, demonstrating zinc oxide and zinc diffusion into the via prefill, in accordance with implementations of the disclosure.

FIG. 7 shows characterization of a via structure processed in accordance with the above-described process, demonstrating zinc oxide and zinc diffusion into the via prefill, in accordance with implementations of the disclosure. In particular, a zinc oxide layer was deposited by ALD and followed by a 350 C forming gas anneal.

The EDS map image 700 shows the presence of Zn, O, and N (a SiN film was included in the structure as indicated). As can be seen, the zinc is predominantly along the sidewalls, over the oxygen of the dielectric oxide, though with some diffusion of the zinc into the sidewall oxide. Notably, zinc is not present over or in the via prefill (beyond trace amounts). The zinc oxide layer has disappeared and the zinc has diffused through the copper via prefill. The zinc is present instead at the interfaces between the copper and the SiN.

The graph 702 shows atomic percentages of O, Cu, Zn, and N as a function of depth, parallel to the underlying copper line. Curves 704, 706, 708, and 710, show the atomic percentage of N, Cu, O, and Zn respectively.

The graph 712 shows atomic percentages of N, O, Cu, and Zn as a function of depth, perpendicular to the underlying copper line. Curves 714, 716, 718, and 720, show the atomic percentage of O, Cu, Zn, and N, respectively.

The graph 722 shows atomic percentages of Si, Cu, Zn, and N as a function of depth across the copper to nitride interface. Curves 724, 726, 728, and 730, show the atomic percentage of Si, Cu, Zn, and N, respectively.

From the foregoing, it can be seen that there is Zn concentration in Cu of about 6 to 8 atomic percent, that decreases with depth. Similar to In, Zn also accumulates at the Cu/SiN interface. Also, there is some Zn precursor penetration into porous low-k dielectric.

Figure 8A:
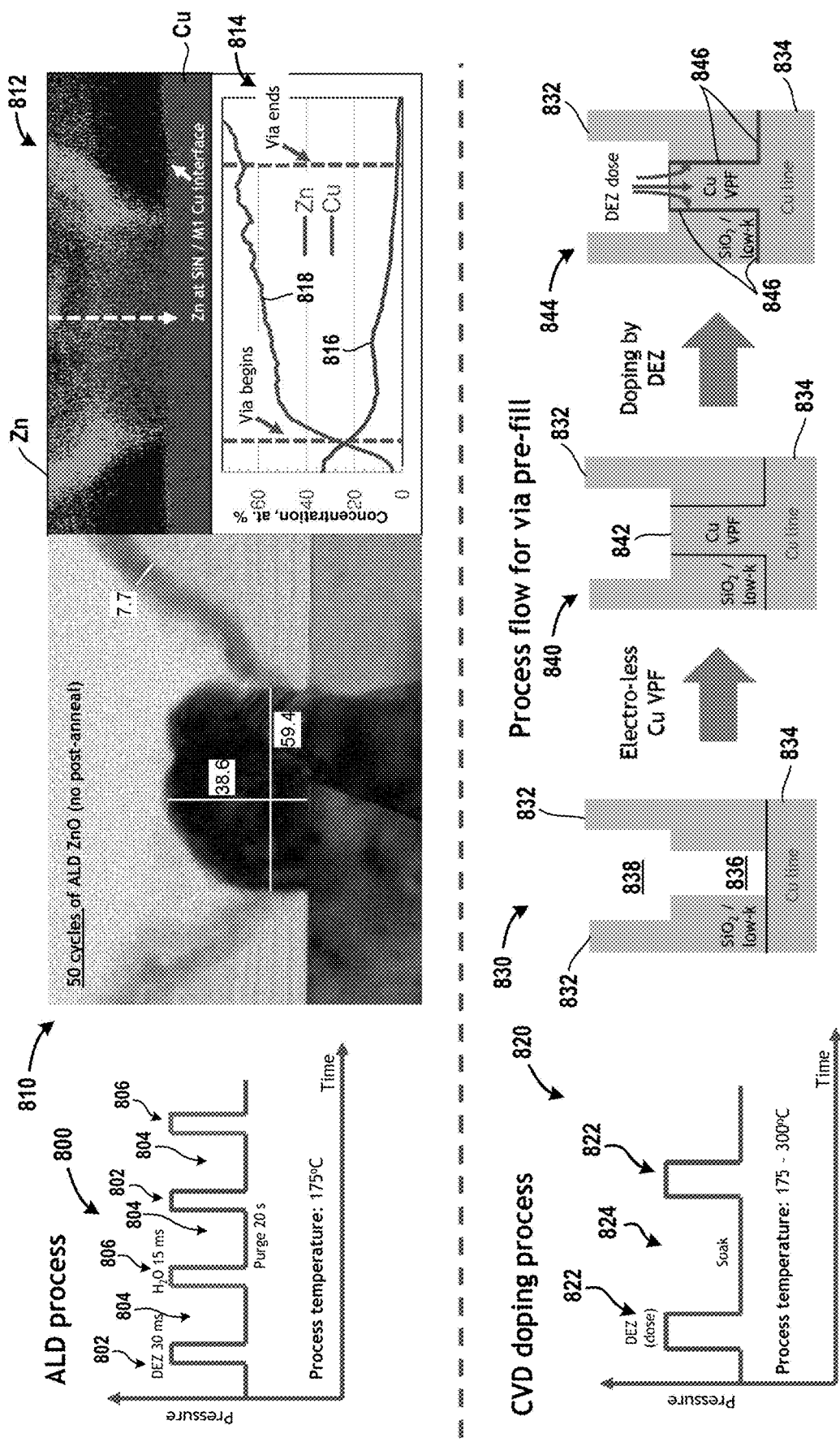
FIG. 8A illustrates processes for doping with an ALD precursor, in accordance with implementations of the disclosure.

FIG. 8A illustrates processes for doping with an ALD precursor, in accordance with implementations of the disclosure. At reference 800, a graph of pressure versus time is shown, illustrating an ALD process. The ALD process consists of alternating 30 ms pulses of diethyl zinc (DEZ) (ref. 802) and 15 ms pulses of water (ref. 806), separated by 20 second purges (ref. 804), and performed at a process temperature of 175 C.

The TEM image 810 shows the dimensions of the via prefill and the thickness of the ZnO layer (in nm) formed after 50 cycles of the above-described ALD process, without a post-anneal operation. A corresponding EDS map image 812 shows the zinc diffusing into the copper via prefill. This is also shown by the graph 814 of atomic percentage of zinc and copper as a function of depth through the via prefill. The curves 816 and 818 show the atomic percentages of zinc and copper, respectively. As can be seen, there is zinc present in the upper portion of the via prefill structure, thus indicating that metallic zinc has dissociated from the DEZ and diffused into the copper.

As can be seen, an ALD precursor such as DEZ may break apart in the presence of metals and with sufficient temperature (e.g. about 150 to 200 C and above). In the present case, copper is acting as a catalyst for dissociation of DEZ into metallic zinc.

In view of these findings, a CVD doping process is provided that takes advantage of this spontaneous thermal dissociation of the ALD precursor. Graph 820 shows pressure versus time for a CVD doping process, in which a dose step (ref. 822) of a metal-containing ALD precursor (e.g. DEZ) is performed, followed by a thermal soak (ref. 824). The process is performed at a relatively high temperature, sufficient to achieve thermal dissociation of the ALD precursor when deposited on the metallic via prefill. In some implementations, the process temperature is in the range of about 175 to 300 C. This cycle is repeated until the desired quantity of dopant metal is diffused into the via prefill.

At reference 830, an etched interconnect structure is shown, including a via 836 and trench 838 etched in a dielectric 832, to form connection to an underlying Cu line 834. An electroless deposition process is performed to selectively deposit a Cu via prefill 842 in the via 836, as shown at reference 840. Then, the via prefill 842 is doped by dosing a metal-containing ALD precursor such as DEZ, and allowing it to soak for a predetermined time, in a repeated cycle as described above. The DEZ thermally dissociates into metallic zinc on the copper via prefill and diffuses into the copper. At sufficient temperature the zinc may diffuse into the copper and also migrate to the interface with the dielectric, to form a self-forming barrier 846 as previously described.

It will be appreciated that a sufficiently high temperature may be required to effect silicate formation at the dielectric interface. In some implementations, the doping process is performed at a first lower temperature (e.g. about 175 to 300 C), and then the process is followed by a post-anneal at a second higher temperature to promote silicate formation (e.g. about 300 to 400 C). Further, it is noted that the zinc may also migrate to the interface between the underlying copper line 834 and the dielectric 832 (or possibly a SiN layer when present). Thus, the self-forming barrier may strengthen the adhesion of not only the via region but also the underlying conductor as well.

An advantage of the above-described process is that no oxidizing agent is required. Use of any oxidizing agent with exposed dielectric can create more defect sites and damage to the dielectric, so it is desirable to not use water or ozone with exposed dielectric, and thus dielectric integrity is better maintained with the present process.

It is noted that without a water pulse as in the ALD process described above, not much zinc was found to be detectable on oxide, and thus, the zinc precursor does not have good adhesion to the oxide.

While doping with zinc and use of the zinc precursor DEZ has been specifically described above, it will be appreciated that other elements and corresponding precursors may be substituted. In some implementations, dimethyl zinc is used as a zinc precursor. In various implementations, other organo metallic ALD precursors can be applied, such as for Zn, In (e.g. trimethyl indium), Sn, or Mn as dopant metals.

Figure 8B:
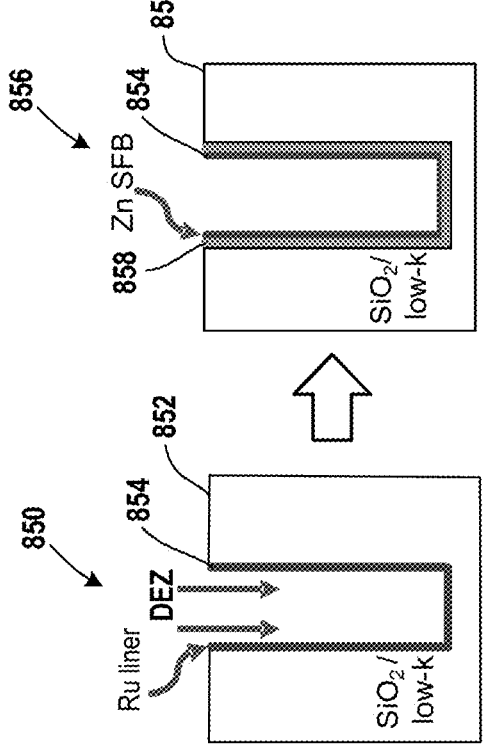
FIG. 8B conceptually illustrates a process for doping of a Ru liner for self forming barrier (SFB) formation, in accordance with implementations of the disclosure.
Figure 8B:
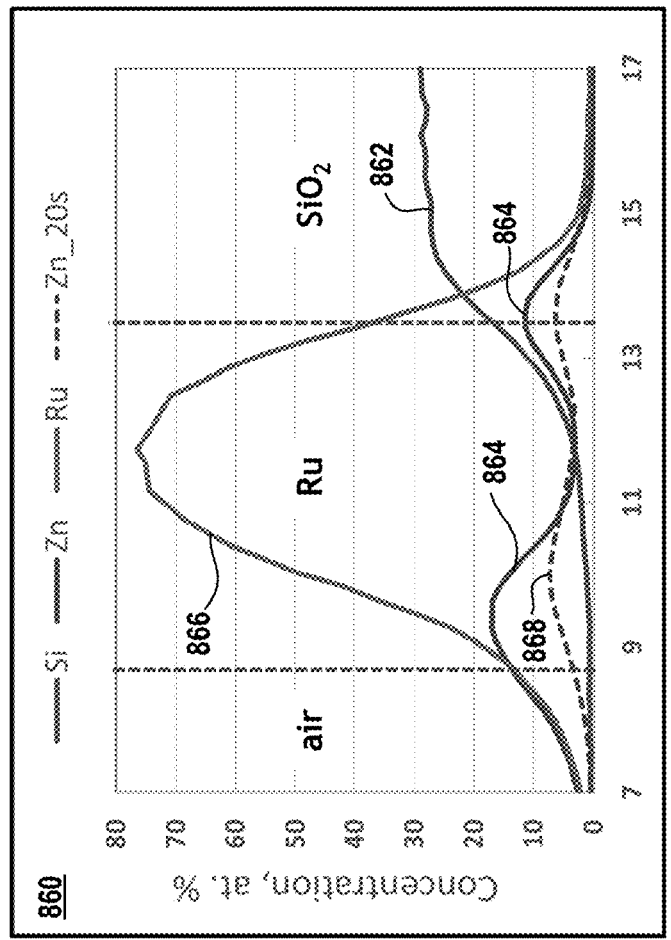

FIG. 8B conceptually illustrates a process for doping of a Ru liner for self forming barrier (SFB) formation, in accordance with implementations of the disclosure. As shown at ref. 850, a via formed in a dielectric 852 (e.g. SiO2, low-k) has been plated with a Ru liner 854. Multiple cycles of a dose and thermal soak process can be performed, thus forming a self forming barrier 858 as shown at ref. 856. One example process was performed at a base pressure of about 4 Torr (725 sccm $N_2$). Each cycle included about a 1 minute exposure to DEZ, followed by a 1 minute thermal soak with 2014 sccm $H_2$ (8 Torr), the pedestal being at a temperature of about 350 C.

After ten cycles, the resulting atomic percentage profile as a function of depth is shown by the graph 860. The curves 862, 864, 866, and 868 show the atomic percentage of Si, Zn, Ru, and zinc oxide, respectively. As can be seen, the Zn is distributed both at the Ru-air interface, and the Ru—SiO2 interface.

Figure 8C:
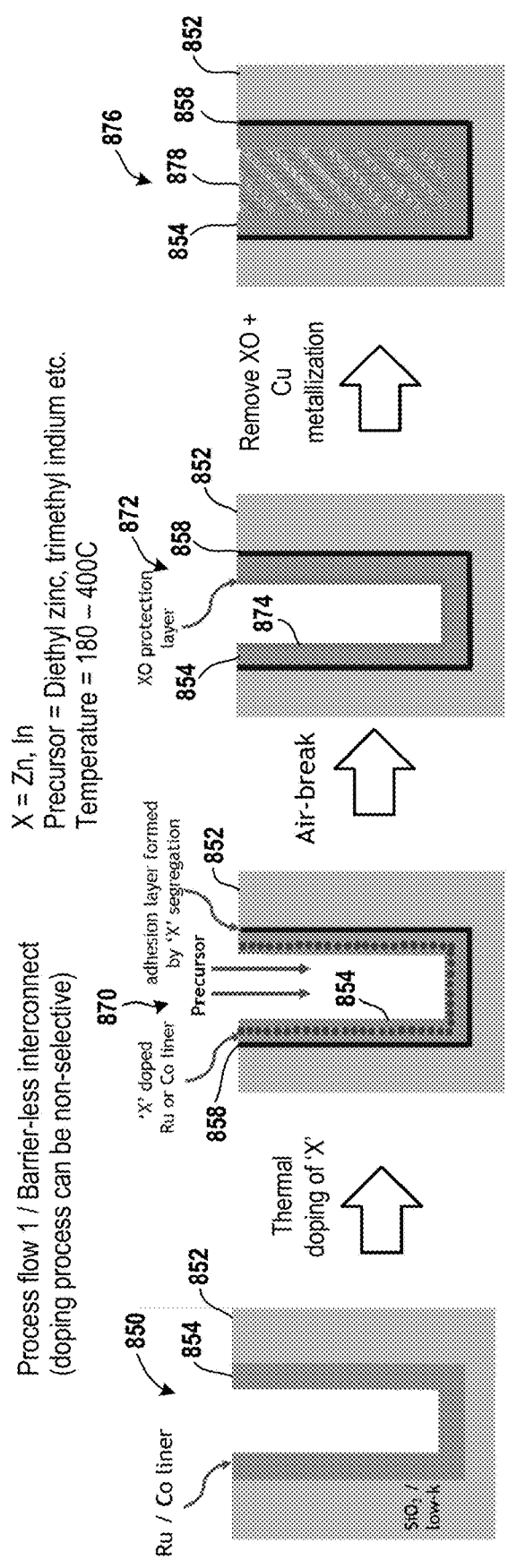
FIG. 8C conceptually illustrates a process for metallization of a via, in accordance with implementations of the disclosure.
Figure 8C:
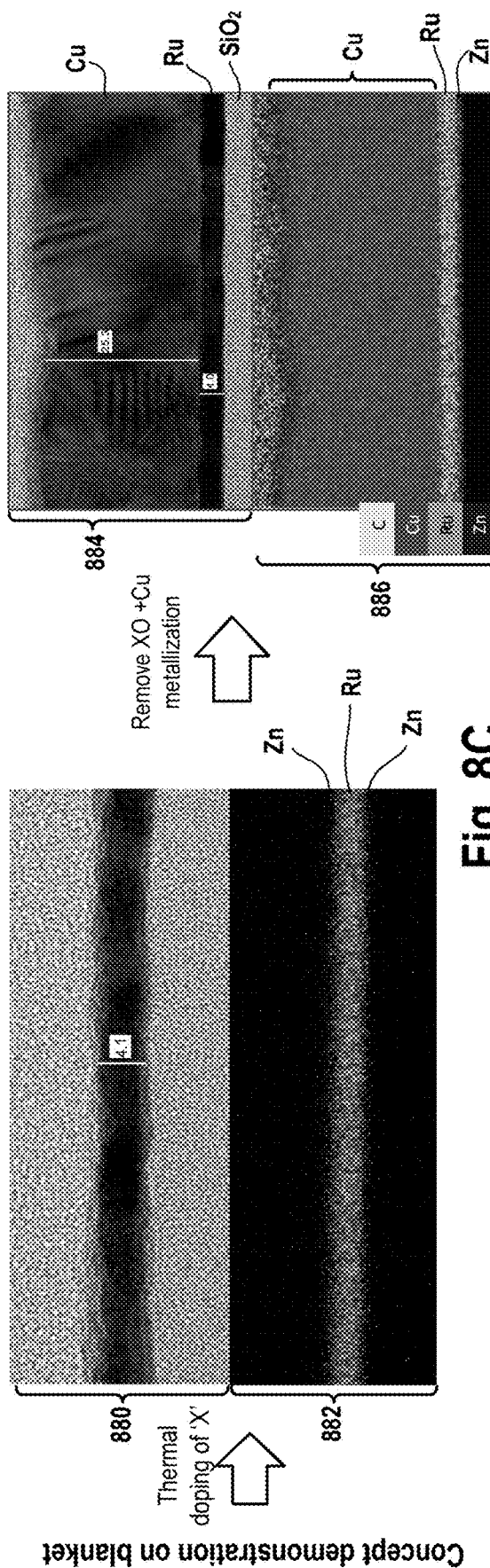

FIG. 8C conceptually illustrates a process for metallization of a via, in accordance with implementations of the disclosure. As shown at ref. 850, a via formed in a dielectric 852, has been plated with a Ru or Co liner 854. At ref. 870, a cyclical process of thermal doping in accordance with that described with reference to FIG. 8B is performed, depositing an element X such as Zn or In onto the Ru liner, wherein the element X migrates to the interface between the liner 854 and the dielectric 852, forming a self-forming adhesion/barrier layer 858. In some implementations the cyclical/doping process is performed at a temperature of about 180 to 400 C. Upon exposure of the substrate to air, then as shown at ref. 872, an oxide layer 874 of the element X (XO protection layer) forms at the surface, which acts as a protective layer passivating the surface of the liner.

Prior to metallization of the via, the oxide layer 874 is removed, such as by annealing in a reducing environment (e.g. forming gas anneal). Then the via is bulk filled with a conductor 878 (e.g. Cu), by any known method for fill deposition, such as ALD, CVD, electroplating, electroless deposition, etc.

The above-described process was demonstrated on a blanket wafer, with TEM and EDS map results shown. Ref. 880 is a TEM image of a cross section showing the band of Ru after Zn doping. The corresponding EDS map 882, shows the Ru portion, but with Zn distributed on both sides of the Ru layer. The TEM image 884 shows SiO2, Ru, and Cu layers following removal of the zinc oxide on the surface and Cu metallization. The corresponding EDS map image 886, illustrates the Zn at the Ru-oxide interface.

Figure 9:
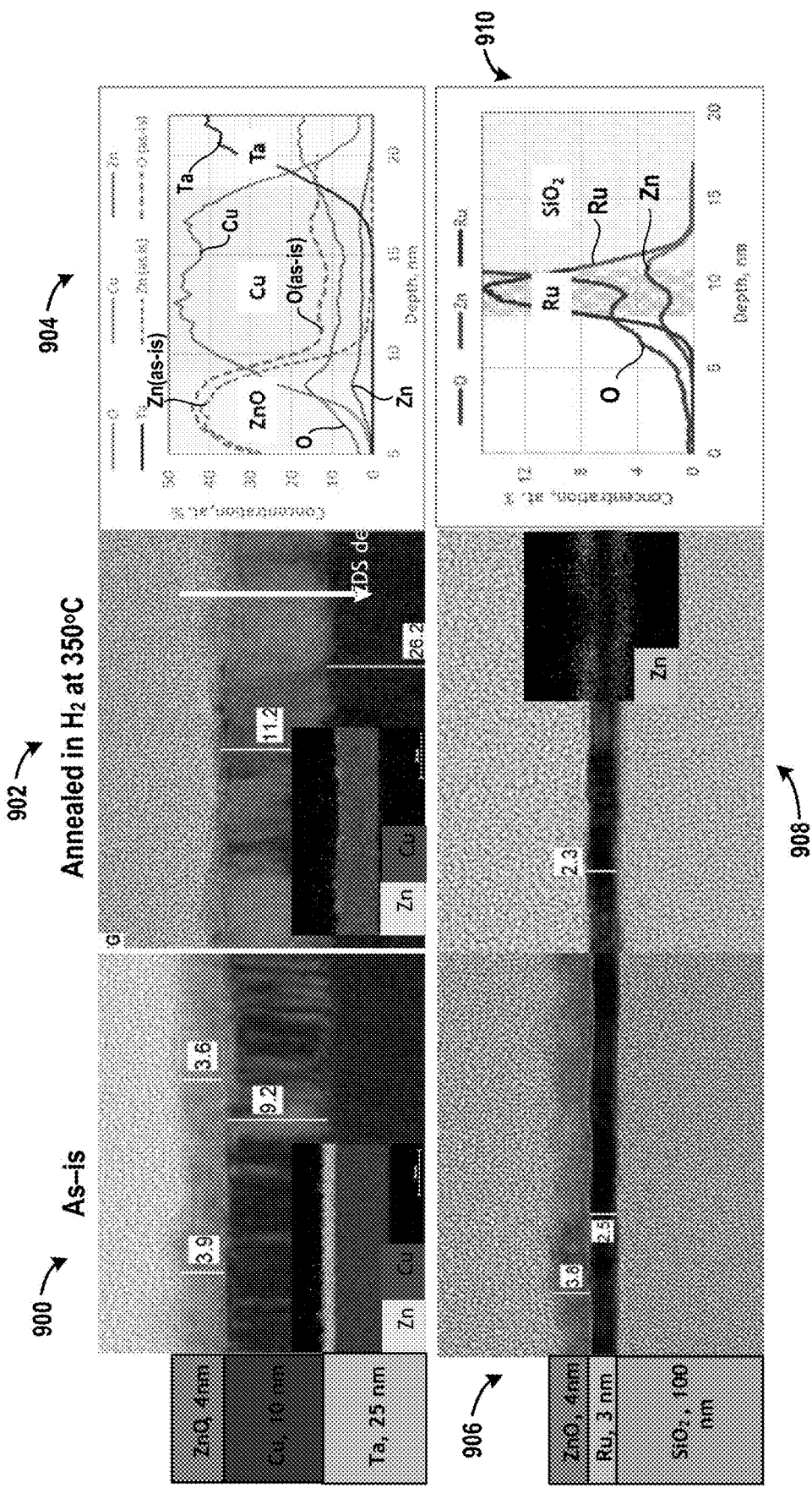
FIG. 9 further illustrates how Zn can be doped into Cu and Ru through deposition of a ZnO layer followed by a thermal treatment, in accordance with implementations of the disclosure.

FIG. 9 further illustrates how Zn can be doped into Cu and Ru through deposition of a ZnO layer followed by a thermal treatment, in accordance with implementations of the disclosure. Results are shown for a blanket wafer, having a PVD zinc oxide layer deposited on copper, both before and after hydrogen treatment.

The EDS map images 900 and 902 show that the zinc oxide layer disappears after the anneal is performed. The zinc oxide is reduced to metallic zinc, which then diffuses into the copper layer. This is also shown by the elemental depth profile 904, The EDS map images 906 and 908, and the depth profile 910 show a similar concept with ruthenium.

Figure 10:
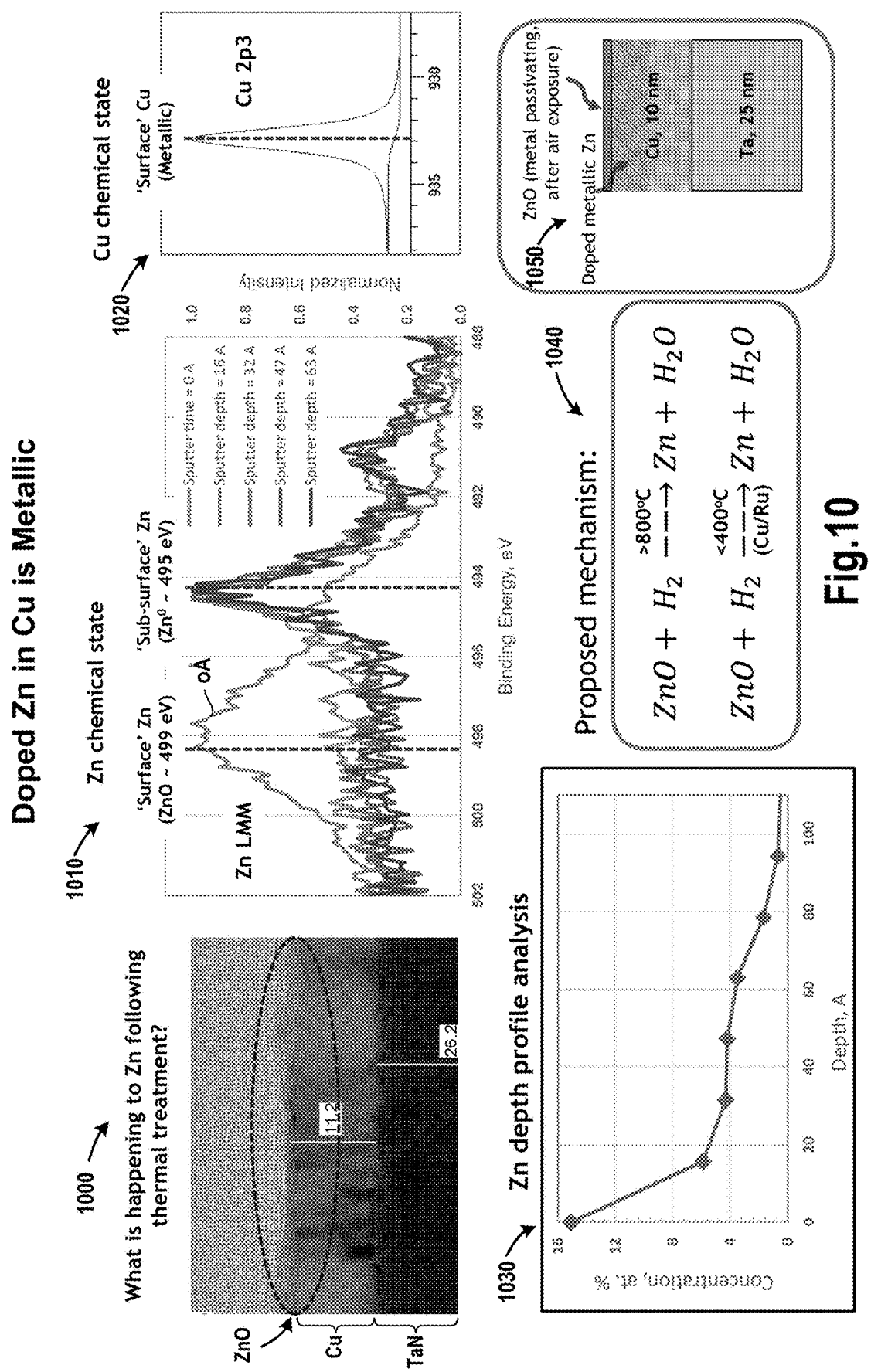
FIG. 10 illustrates how doped Zn in Cu is metallic, whereas when exposed to air, zinc may create a zinc oxide layer on top of the Cu, in accordance with implementations of the disclosure.

FIG. 10 illustrates how doped Zn in Cu is metallic, whereas when exposed to air, zinc may create a zinc oxide layer on top of the Cu, in accordance with implementations of the disclosure. The illustrated figures demonstrate that when zinc is reduced and diffuses into copper, that process is done in vacuum, and when exposed to air, some of the diffused metallic zinc comes out and passivates the copper, by creating a self-forming zinc oxide layer on top of the copper layer which prevents copper oxidation. The TEM image 1000 shows the Cu and TaN layers, with a ZnO layer on top of the Cu.

An XPS study of the copper surface state is shown at reference 1010, demonstrating the Zn peak at 0 angstroms sputter depth (i.e. at the surface) corresponding to ZnO. This shows the zinc at the surface is zinc oxide; whereas if the top layer is sputtered away, then zinc in copper is metallic zinc (forming a reservoir of metallic zinc that stays in the copper layer.

Reference 1020 illustrates the chemical state of the surface Cu, demonstrating it to be metallic.

The Zn depth profile analysis shown at reference 1030 shows the high concentration of zinc at the surface, and decreasing with depth.

At reference 1040 it is shown that the presence of Cu or Ru as a catalyst may lower the reduction temperature of ZnO to less than 400 C.

In the illustrated implementation, there is a TaN layer, so zinc is being blocked from migrating to an underlying oxide. However, in the case where there is no TaN layer (e.g. in a via), then zinc oxide is reduced to metallic zinc, which diffuses into ruthenium and segregates into the two interfaces that have oxygen—the Ru-oxide interface at the bottom, and the top of the Ru where the Zn oxidizes when exposed to air.

Reference 1050 shows a mechanism—whereby zinc oxide is reduced to metallic zinc, which diffuses into copper; and that zinc is reactive so when the substrate is brought out to atmospheric conditions, a portion of it comes out and forms a ZnO layer that protects the copper from oxidation.

Figure 11:
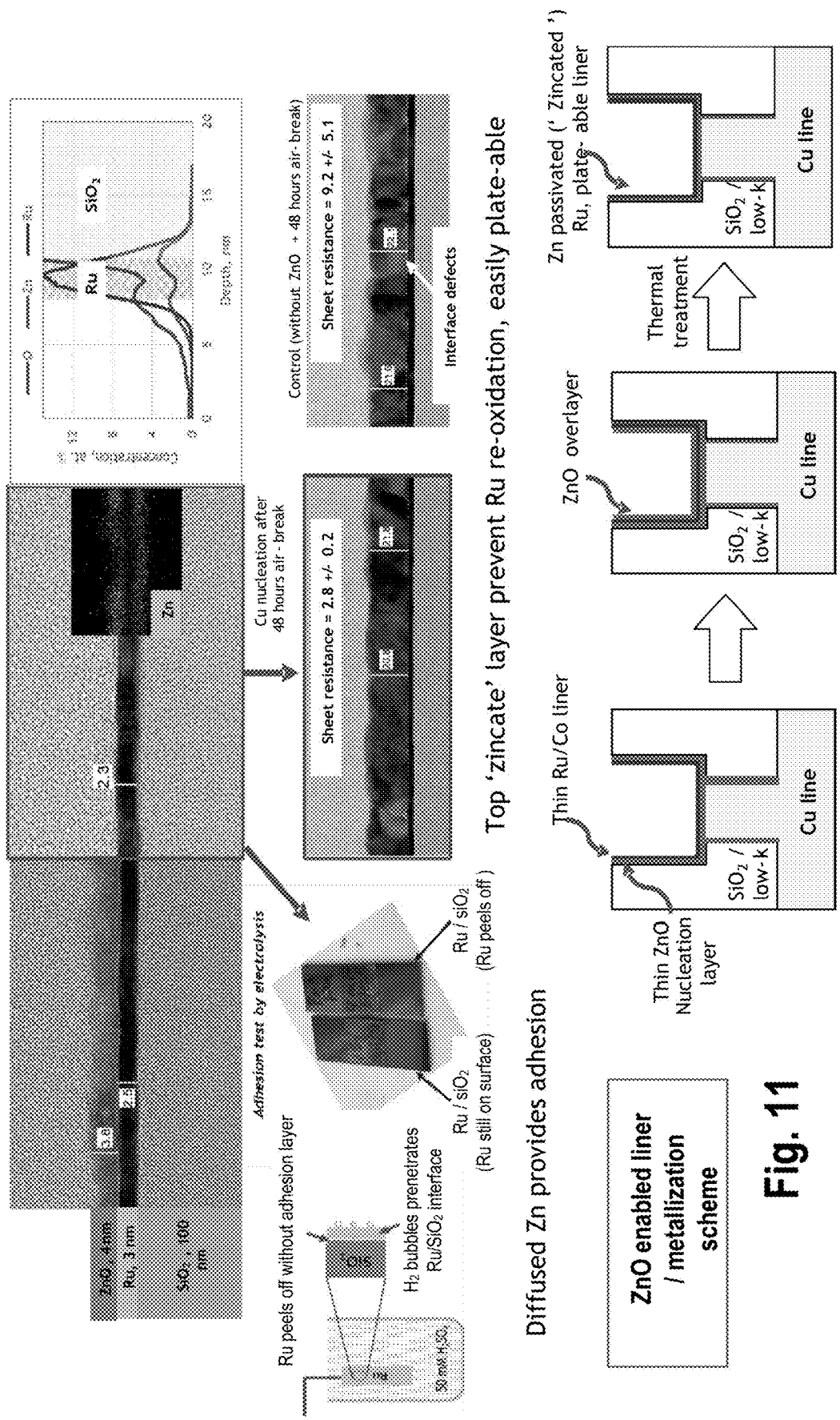
FIG. 11 illustrates how concepts of the present disclosure can be applied to enable a directly plateable liner, in accordance with implementations of the disclosure.

FIG. 11 illustrates how concepts of the present disclosure can be applied to enable a directly plateable liner, in accordance with implementations of the disclosure.

In some implementations, a controller is part of a system that may be configured to perform operations or methods in accordance with implementations of the disclosure. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 12:
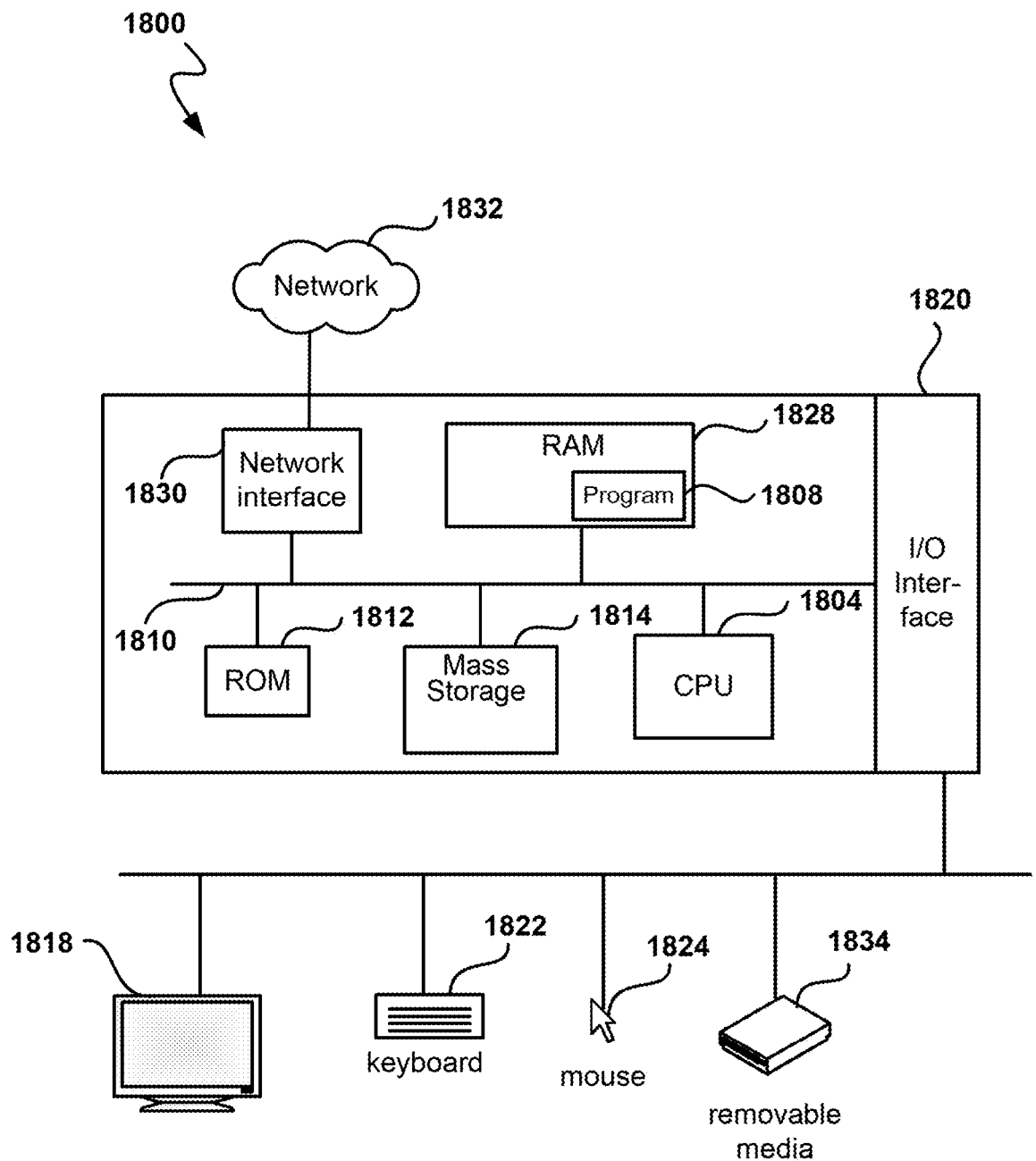
FIG. 12 is a simplified schematic diagram of a computer system for implementing implementations of the present disclosure.

FIG. 12 is a simplified schematic diagram of a computer system for implementing implementations of the present disclosure. It should be appreciated that the methods described herein may be performed with a digital processing system, such as a conventional, general-purpose computer system. Special purpose computers, which are designed or programmed to perform only one function may be used in the alternative. The computer system 1800 includes a central processing unit (CPU) 1804, which is coupled through bus 1810 to random access memory (RAM) 1828, read-only memory (ROM) 1812, and mass storage device 1814. System controller program 1808 resides in random access memory (RAM) 1828, but can also reside in mass storage 1814.

Mass storage device 1814 represents a persistent data storage device such as a floppy disc drive or a fixed disc drive, which may be local or remote. Network interface 1830 provides connections via network 1832, allowing communications with other devices. It should be appreciated that CPU 1804 may be embodied in a general-purpose processor, a special purpose processor, or a specially programmed logic device. Input/Output (I/O) interface 1820 provides communication with different peripherals and is connected with CPU 1804, RAM 1828, ROM 1812, and mass storage device 1814, through bus 1810. Sample peripherals include display 1818, keyboard 1822, cursor control 1824, removable media device 1834, etc.

Display 1818 is configured to display the user interfaces described herein. Keyboard 1822, cursor control (mouse) 1824, removable media device 1834, and other peripherals are coupled to I/O interface 1820 to communicate information in command selections to CPU 1804. It should be appreciated that data to and from external devices may be communicated through I/O interface 1820. The implementations can also be practiced in distributed computing environments where tasks are performed by remote processing devices that are linked through a wire-based or wireless network.

Implementations may be practiced with various computer system configurations including hand-held devices, microprocessor systems, microprocessor-based or programmable consumer electronics, minicomputers, mainframe computers and the like. The implementations can also be practiced in distributed computing environments where tasks are performed by remote processing devices that are linked through a network.

With the above implementations in mind, it should be understood that the implementations can employ various computer-implemented operations involving data stored in computer systems. These operations are those requiring physical manipulation of physical quantities. Any of the operations described herein that form part of the implementations are useful machine operations. The implementations also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more implementations can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Accordingly, the disclosure of the example implementations is intended to be illustrative, but not limiting, of the scope of the disclosures, which are set forth in the following claims and their equivalents. Although example implementations of the disclosures have been described in some detail for purposes of clarity of understanding, it will be apparent that certain changes and modifications can be practiced within the scope of the following claims. In the following claims, elements and/or steps do not imply any particular order of operation, unless explicitly stated in the claims or implicitly required by the disclosure.

The invention claimed is:

1. A method for forming a self-forming barrier in a feature of a substrate, comprising:
   depositing a metallic liner in the feature of the substrate, the metallic liner being deposited over a dielectric of the substrate;
   depositing a zinc-containing precursor over the metallic liner;
   performing a thermal soak of the substrate;
   repeating the depositing of the zinc-containing precursor and the thermal soak of the substrate for a predefined number of cycles;
   wherein the method forms a zinc-containing barrier layer at an interface between the metallic liner and the dielectric.

2. The method of claim 1, wherein the metallic liner consists of ruthenium.

3. The method of claim 1, wherein the metallic liner consists of cobalt.

4. The method of claim 1, wherein the feature is a via.

5. The method of claim 1, wherein the feature is an interconnect.

6. The method of claim 1, wherein the zinc-containing precursor is diethyl zinc.

7. The method of claim 1, wherein depositing the zinc-containing precursor is performed by a chemical vapor deposition process.

8. The method of claim 1, wherein the thermal soak is performed at a temperature of about 180 to 400 C.

9. The method of claim 1, further comprising:
   after the repeating for the predefined number of cycles, then depositing a conductor in the feature of the substrate.

10. The method of claim 9, wherein the conductor is copper.

11. A method for forming a self-forming barrier in a feature of a substrate, comprising:
    depositing a metallic liner in the feature of the substrate, the metallic liner being deposited over a dielectric of the substrate;
    depositing an indium-containing precursor over the metallic liner;
    performing a thermal soak of the substrate;
    repeating the depositing of the indium-containing precursor and the thermal soak of the substrate for a predefined number of cycles;
    wherein the method forms a indium-containing barrier layer at an interface between the metallic liner and the dielectric.

12. The method of claim 11, wherein the metallic liner consists of ruthenium.

13. The method of claim 11, wherein the metallic liner consists of cobalt.

14. The method of claim 11, wherein the feature is a via.

15. The method of claim 11, wherein the feature is an interconnect.

16. The method of claim 11, wherein the indium-containing precursor is trimethyl indium.

17. The method of claim 11, wherein depositing the indium-containing precursor is performed by a chemical vapor deposition process.

18. The method of claim 11, wherein the thermal soak is performed at a temperature of about 180 to 400 C.

19. The method of claim 11, further comprising:
    after the repeating for the predefined number of cycles, then depositing a conductor in the feature of the substrate.

20. The method of claim 19, wherein the conductor is copper.

* * * * *